United States Patent [19]

Katunin et al.

[11] 4,289,974
[45] Sep. 15, 1981

[54] VOLTAGE FREQUENCY METER OF SYNCHRONOUS ELECTRICAL MACHINE

[76] Inventors: Vladimir M. Katunin, ulitsa Shefskaya, 30, kv. 8; Vladimir G. Nakrokhin, ulitsa Baumana, 32a, kv. 9, both of Sverdlovsk, U.S.S.R.

[21] Appl. No.: 78,662

[22] Filed: Sep. 24, 1979

[30] Foreign Application Priority Data

Jan. 18, 1979 [SU] U.S.S.R. ............... 2715253

[51] Int. Cl.³ .................... H03K 5/00; H03K 5/22
[52] U.S. Cl. .................... 307/527; 328/140
[58] Field of Search ............. 328/140; 307/233 R

[56] References Cited

U.S. PATENT DOCUMENTS

| | | | |
|---|---|---|---|
| 2,999,168 | 9/1961 | Henry | 307/233 |
| 3,471,792 | 10/1969 | Axford | 307/233 |
| 3,717,818 | 2/1973 | Herbst | 328/141 |
| 3,969,677 | 7/1967 | Woyton | 328/140 |

*Primary Examiner*—Harold A. Dixon
*Attorney, Agent, or Firm*—Steinberg & Raskin

[57] ABSTRACT

The invention is concerned with a voltage frequency meter of a synchronous electrical machine, comprising a voltage converter connected to inputs of two frequency measuring channels which have their outputs connected via a voltage follower to an input of a voltage comparator. Each of the frequency measuring channels includes a zero-crossing detector, two transistor switches, a differentiating circuit, a charging resistor, a decoupling diode, an isolating diode and a storage capacitor. The first transistor switch of each channel has its output connected via the charging resistor to a power source and via the isolating diode to the output of the second transistor switch and to the storage capacitor which is connected via the decoupling diode to the input of the voltage follower. In one of the frequency measuring channels, the input of the second transistor switch is connected via the differentiating circuit to the output of the zero-crossing detector of the other frequency measuring channel. The power source is also connected to an adjusting resistor whose movable contact is connected to the outputs of the second transistor switches of both frequency measuring channels.

1 Claim, 9 Drawing Figures

VOLTAGE FREQUENCY METER OF SYNCHRONOUS ELECTRICAL MACHINE

FIELD OF THE INVENTION

The present invention relates to electric instrument making and, more particularly, to a voltage frequency meter of a synchronous electrical machine.

The invention is applicable to automatic voltage regulators of synchronous electrical machines.

BACKGROUND OF THE INVENTION

There is known a frequency meter incorporated in an automatic excitation voltage regulator and comprising a single frequency measuring channel which includes two resonance circuits. The resonance frequencies of these circuits are 45 Hz and 55 Hz, respectively (cf. Standard Automatic Voltage Regulator of the ARV-SD Type. Technical Description—a publication by the V. I. Lenin All-Union Electrotechnical Institute in Moscow).

This meter measures deviations of the input voltage frequency from a preset value.

It is disadvantageous, however, in that the voltage at its output is dependent not only on the frequency, but also on the magnitude of the input voltage. Another disadvantage is the presence of a filter at the meter's output. The filter has a great time constant, which factor impairs the effectiveness of regulating the excitation voltage of a synchronous electrical machine.

There is further known a frequency meter comprising a power source and a voltage summation unit whose input is connected via a voltage follower to the output of a measuring channel. The latter comprises a zero-crossing detector whose input is connected to the output of a voltage converter, and also includes a storage capacitor and two transistor switches whereof the first has its input connected to the output of the zero-crossing detector and to the input of the second transistor switch which has its output connected to the storage capacitor and voltage follower. The latter has its ouput connected to the input of the voltage summation unit (cf. Automatic Regulation and Control of Power Systems. Transactions of the V. I. Lenin All-Union Electrotechnical Institute, Series 83, Energia Publishers, Moscow, 1977). The meter described above measures deviations of the input voltage frequency from a preset value, while eliminating the effects of the output voltage on the magnitude on the input voltage.

However, the deviation of the input voltage frequency from a preset value is measured only once over a period of this voltage. As a result, at the output of the meter there is produced a signal whose amplitude is indeed proportional to the deviation of the input voltage frequency from a preset value. The problem, however, resides in the fact that this signal is delayed, and the time lag is equal to the input voltage period. There is a smoothing filter at the meter's output, which accounts for an increased time constant of the measuring channel. This factor and the above-mentioned time lag impair the effectiveness of regulating the excitation voltage of a synchronous electrical machine.

SUMMARY OF THE INVENTION

It is an object of the present invention to provide a voltage frequency meter for a synchronous electrical machine, which would have an increased operating speed due to the absence of inertia elements in the frequency measuring channel and due to a reduced interval between two measurements of the input voltage frequency.

The foregoing object is attained by providing a voltage frequency meter of a synchronous electrical machine, comprising a voltage converter connected to an input of a measuring channel including a zero-crossing detector, a storage capacitor and two transistor switches and connected with its output via a voltage follower to an input of a voltage summation unit, which frequency meter is characterized in that it includes a second frequency measuring channel connected to another output of the voltage converter and containing a zero-crossing detector, two transistor switches, a differentiating circuit, a charging resistor, a decoupling diode, an isolating diode and a storage capacitor, and in that the first frequency measuring channel is additionally provided with a differentiating circuit, a decoupling diode, an isolating diode and a charging resistor, an output of the first transistor switch of each frequency measuring channel being connected via the charging resistor to the power source and via the isolating diode to an output of the second transistor switch and to the storage capacitor connected via the decoupling diode to the input of the voltage follower, the second transistor in one of the channels having its input connected via the differentiating circuit of that channel to an output of the Zero-crossing detector of the other measuring channel, the power source being connected to an adjusting resistor whose movable contact is connected to the outputs of the second transistor switches of both frequency measuring channels.

The frequency meter according to the invention takes two measurements of a deviation of the input voltage frequency from a preset value during one period; as a result, the time lag of the output signal with respect to the input signal is reduced two-fold and amounts to no more than one half-period of the input voltage. The frequency meter according to the invention also dispenses with the necessity of having a smoothing filter at the output of each frequency measuring channel.

BRIEF DESCRIPTION OF THE ACCOMPANYING DRAWINGS

The foregoing and other objects and advantages of the present invention will become more apparent from a consideration of the following detailed description of a preferred embodiment thereof, taken in conjunction with the accompanying drawings, wherein.

DETAILED DESCRIPTION OF THE INVENTION

Figure 1:
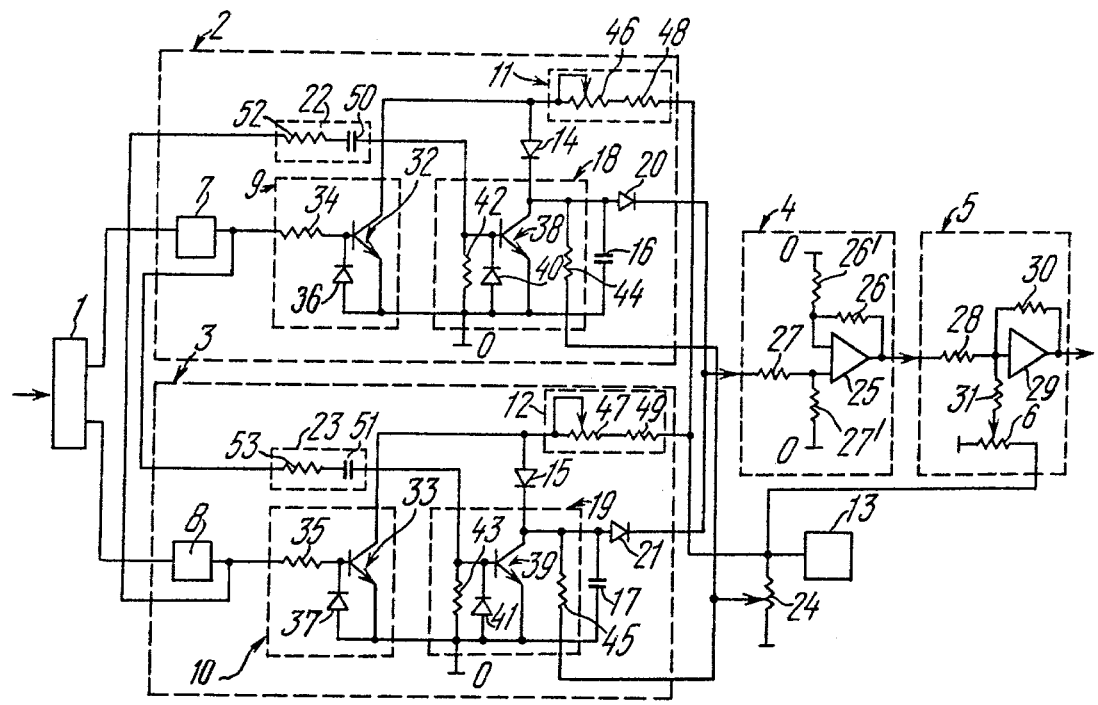
FIG. 1 is a key diagram of a voltage frequency meter of a synchronous electrical machine, in accordance with the invention.

Referring to the attached drawings, the voltage frequency meter of a synchronous electrical machine comprises, in accordance with the invention, a voltage converter 1 (FIG. 1) having two outputs and intended to convert sinusoidal input voltage to output voltage which is also sinusoidal and of the same frequency, but shifted in phase by 180° in relation to input voltage.

The outputs of the voltage converter 1 are connected to inputs of frequency measuring channels 2 and 3, respectively, whereof each is intended to convert sinusoidal input voltage to linearly rising voltage. The channels 2 and 3 are also intended to measure and store the linearly rising voltage during each half-period of the sinusoidal input voltage. Outputs of both frequency measuring channels 2 and 3 are connected to an input of a voltage follower 4 which has a great input resistance and is meant to add signals arriving from the outputs of the frequency measuring channels 2 and 3. An output of the voltage follower 4 is connected to an input of a voltage summation unit 5 which adds voltage at the output of the follower 4 to voltage across a movable contact of an adjusting resistor 6 which sets the voltage of the frequency meter.

Circuitry-wise, the frequency measuring channels 2 and 3 are identical, each comprising zero-crossing detectors 7 and 8, respectively, which convert sinusoidal input voltages to bipolar square signals whereof the frequency and on-off time ratio are equal to those of the input voltage. The zero-crossing detectors 7 and 8 have their outputs connected to an input of one of transistor switches 9 and 10, respectively. Outputs of the transistor switches 9 and 10 are connected via respective charging resistors 11 and 12 to a power source 13 and via isolating diodes 14 and 15 to storage capacitors 16 and 17 and to outputs of second transistor switches 18 and 19. The transistor switches 18 and 19 are connected via decoupling diodes 20 and 21 to the input of the voltage follower 4. An input of the transistor switch 18 of the channel 2 is connected via a differentiating circuit 22 to the output of the zero-crossing detector 8 of the other frequency measuring channel 3 wherein the input of the transistor switch 19 is connected via a differentiating circuit 23 to the output of the zero-crossing detector 7 of the frequency measuring channel 2.

The differentiating circuits 22 and 23 are intended to form narrow pulses to ensure a rapid discharge of the storage capacitors 16 and 17 at the moment of switching of the zero-crossing detectors. The transistor switches 9, 10, 18 and 19 are intended for the respective charging and discharge circuits of the storage capacitors 16 and 17. The power source 13 is connected to a second adjusting resistor 24 whose movable contact is connected to the outputs of the transistor switches 18 and 19. The adjusting resistor 24 is intended to compensate for drops of voltage across the storage capacitors 16 and 17 due to leakage currents. The voltage follower 4 is of the conventional type and comprises an operational amplifier 25 with a negative feedback loop containing a resistor 26 which is connected to a zero bus via a resistor 26'. The outputs of the channels 2 and 3 are connected via a resistor 27 to a direct input of the operational amplifier 25, which accounts for a great input resistance of the voltage follower 4. The direct input of the operational amplifier 25 is connected to the zero bus via a resistor 27'. The output of the voltage follower 4 is connected via a resistor 28 to an inverting input of an operational amplifier 29 of the voltage summation unit 5. A resistor 30 provides negative feedback for the operational amplifier 29 whose inverting input is connected via a resistor 31 to the movable contact of the adjusting resistor 6.

The transistor switches 9, 18 and 10, 19 of the frequency measuring channels 2 and 3, respectively, are of the conventional type. The transistor switches 9 and 10 comprise n-p-n transistors 32 and 33 whose bases are connected to resistors 34 and 35, respectively, and also connected to the emitters via diodes 36 and 37. The transistor switches 18 and 19 comprise n-p-n transistors 38 and 39 whose bases are connected to the differentiating circuits 22 and 23 and to their respective emitters. The point of connection of the base of each of the transistors 38 and 39 to the respective emitters is connected to leads of diodes 40 and 41 and resistors 42 and 43, respectively. Second leads of the diodes 40 and 41 and resistors 42 and 43 are connected to the zero bus designated as "0". Arranged at the outputs of the transistor switches 18 and 19 are resistors 44 and 45, respectively, each having its first lead connected to the collector of the transistor 38 and 39, respectively, whereas their second leads are connected to the movable contact of the adjusting resistor 24. Each of the charging resistors 11 and 12 comprises, in a series arrangement, an adjusting resistor 46 and 47, respectively, and resistors 48 and 49, respectively. Each of the differentiating circuits 22 and 23 comprises, in a series arrangement, capacitors 50 and 51, respectively, and resistors 52 and 53, respectively.

Figure 2:
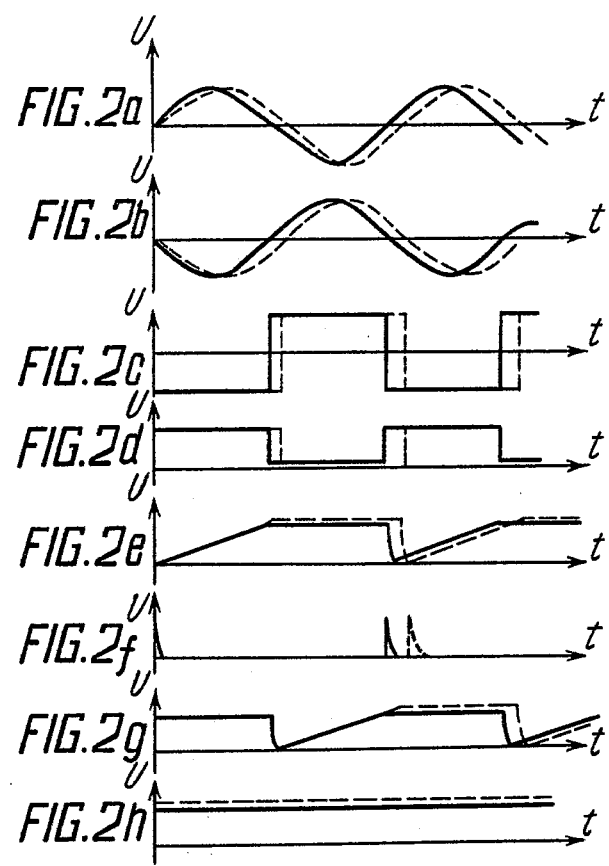
FIGS. 2a–2h show time plots of voltage at representative points of the circuitry of the voltage frequency meter in accordance with the invention.

FIG. 2 shows time plots a, b, c, d, e, f, g, h of voltage across representative points of the circuitry of the voltage frequency meter in accordance with the invention, and are meant to illustrate operation of the meter. Time t is plotted as abscissas and voltage V is plotted as ordinates.

The voltage frequency meter of a synchronous electrical machine according to the invention operates as follows. From the output terminals of a synchronous electrical machine (not shown), sinusoidal voltage is applied to the input of the voltage converter 1 at whose outputs there are produced sinusoidal voltages shifted by 180° in relation to each other (FIGS. 2a and 2b).

From the outputs of the converter 1, these voltages are applied to the inputs of the frequency measuring channels 2 and 3, respectively. During each half-period of the sinusoidal input voltage, the channels 2 and 3 convert this voltage to linearly rising voltage whereof the amplitude is proportional to the input voltage frequency. The channels 2 and 3 also store the latter voltage during the next half-period.

Consider the conversion of sinusoidal input voltage with reference to the frequency measuring channel 2. Square-wave voltage (FIG. 2c) is produced at the output of the zero-crossing detector 7. The output voltages of the frequency measuring channels 2 and 3 are shifted in phase by 180° in relation to each other; as a result, there is practically constant voltage at the input of the voltage follower 4, whereof the amplitude is proportional to the input voltage frequency. From the output of the follower 4, the voltage is applied to the input of the voltage summation unit 5 which compares it to the voltage across the resistor 6. With an input voltage frequency of 50 Hz, the resistor 6 sets the output voltage of the unit 5 at zero level. If the frequency of the input voltage deviates from the preset value of 50 Hz, voltage is produced at the output of the unit 5. The greater the deviation of the input voltage frequency from 50 Hz, the greater the voltage at the output of the unit 5.

Consider now in more detail operation of the frequency measuring channels 2 and 3 with reference to the time plots of FIG. 2 where voltages corresponding to the equality of the frequency to a specified value are shown by a solid line. The channel 2 will be taken as an example.

The voltages applied from the output of the converter 1 (FIG. 2a) to the input of the zero-crossing detector 7 produce a bipolar square signal (FIG. 2c) at the latter's output. The frequency and on-off time ratio of this signal are equal to those of the input voltage (FIG. 2a). During the negative half-period of the square-wave voltage (FIG. 2c), the transistor switch 9 (FIG. 1) is off (FIG. 2d), and the stabilized power source 13 charges (FIG. 2e) the storage capacitor 16 (FIG. 1) through the charging resistor 11. The charging of the storage capacitor 16 (FIG. 1) is discontinued as the polarity of the signal at the output of the zero-crossing detector 7 (FIG. 1) is reversed (FIG. 2e). The charge of the capacitor 16 remains constant for all practical purposes during the entire positive half-period of the input voltage (FIG. 2a), which is due to a great input resistance of the voltage follower 4 (FIG. 1). The second voltage frequency measuring channel 3 forms voltages which are similar to those described above, but shifted by 180° in relation to the former. As the negative polarity of voltage at the output of the zero-crossing detector 8 of the channel 3 is changed to the positive, a positive polarity pulse (FIG. 2f) is produced at the output of the differentiating circuit 22 of the channel 2. This pulse drives the transistor switch 18 (FIG. 1) into conduction, and the storage capacitor 16 (FIG. 2e) discharges. The time plot 2g shows the shape of voltage across the storage capacitor 17 (FIG. 1) of the channel 3, which is shifted by 180° with respect to voltage across the storage capacitor 16 (FIG. 2e). The follower 4 (FIG. 1) adds up these voltages (FIGS. 2e and 2g) so that its output voltage (FIG. 2h) is constant for all practical purposes. This voltage is compared by the unit 5 (FIG. 1) to constant voltage across the resistor 6.

Consider a situation when the input voltage frequency differs from a specified value. Let it be assumed that this frequency is lower than required. Such a case is illustrated by the dash line in the time plots of FIG. 2. The duration of the pulse at the output of the zero-crossing detector 7 (FIG. 1) increases (FIG. 2c). The amplitude of voltage across the storage capacitor 16 (FIG. 1) also increases (FIG. 2e), which means an increase of constant voltages (FIGS. 2e and 2g) at the outputs of the channels 2 and 3. As a result, the constant voltage at the output of the follower 4 increases in proportion to the change of the input voltage frequency, and a constant voltage signal is produced at the output of the unit 5, whose magnitude is proportional to the deviation of the frequency from the prescribed value.

Thus the frequency meter according to the invention takes two input frequency measurements during a single period, which raises the accuracy of measurements and cuts down the time lag in channels 2 and 3 two-fold. The frequency meter of this invention needs no smoothing filters, which further reduces the time lag.

When incorporated in an automatic excitation regulator of a synchronous electrical machine, the frequency meter of this invention improves the regulator's effectiveness. In the case of synchronous motors which operate at manifestly variable loads, this means a more effective damping of rotor vibrations and reduces the fluctuations of the reactive power, frequency and voltage. In the case of synchronous generators, the frequency meter according to the invention raises the static and dynamic stability of power transmission and effectively reduces voltage fluctuations in power systems.

What is claimed is:

1. A voltage frequency meter of a synchronous electrical machine, comprising:
    a voltage converter having two outputs;
    a first input voltage measuring channel and a second input voltage measuring channel, their inputs being connected to said outputs of said voltage converter;
    a voltage follower;
    outputs of said frequency measuring channels being connected to an input of the voltage follower;
    a power source;
    a voltage comparator having a first input connected to an output of said voltage follower, and a second input connected to said power source;
    an adjusting resistor having a movable contact;
    each of said input voltage frequency measuring channels containing:
    a zero-crossing detector intended to convert sinusoidal voltage to square-wave voltage;
    two transistor switches, the first having its input connected to an output of said zero-crossing detector;
    a differentiating circuit connected to an input of said second transistor switch;
    a charging resistor;
    an isolating diode;
    a decoupling diode;
    a storage capacitor;
    an output of the first transistor switch being connected to said power source via said charging resistor and via said isolating diode to the output of said second transistor switch and to said storage capacitor;
    said storage capacitor being connected via said decoupling diode to the input of said voltage follower;
    the input of said second transistor switch of said first frequency measuring channel being connected via said differentiating circuit of said first channel to the output of said zero-crossing detector of said second frequency measuring channel;
    the input of said second transistor switch of said second frequency measuring channel being connected via said differentiating circuit of that frequency measuring channel to the output of said zero-crossing detector of said first frequency measuring channel;
    said power source being connected to said adjusting resistor whereof the movable contact is connected to the output of said second transistor switch of each of said frequency measuring channels.

* * * * *